United States Patent
Mos et al.

(10) Patent No.: US 7,599,064 B2
(45) Date of Patent: Oct. 6, 2009

(54) INSPECTION METHOD AND APPARATUS, LITHOGRAPHIC APPARATUS, LITHOGRAPHIC PROCESSING CELL AND DEVICE MANUFACTURING METHOD, SUBSTRATE FOR USE IN THE METHODS

(75) Inventors: Everhardus Cornelis Mos, Best (NL); Arie Jeffrey Den Boef, Waalre (NL); Maurits Van Der Schaar, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 362 days.

(21) Appl. No.: 11/714,904

(22) Filed: Mar. 7, 2007

(65) Prior Publication Data
US 2008/0218767 A1    Sep. 11, 2008

(51) Int. Cl.
*G01B 11/00* (2006.01)

(52) U.S. Cl. ............. 356/401; 356/635; 356/601; 356/445; 257/787; 430/5; 430/22

(58) Field of Classification Search ........... 356/400, 356/401, 635, 601, 445; 257/787; 430/5, 430/22, 30, 322
See application file for complete search history.

(56) References Cited

U.S. PATENT DOCUMENTS

| | | | | |
|---|---|---|---|---|
| 5,506,684 A * | 4/1996 | Ota et al. | ............. | 356/401 |
| 5,689,339 A * | 11/1997 | Ota et al. | ............. | 356/401 |
| 5,703,692 A | 12/1997 | McNeil et al. | ............. | 356/445 |
| 5,880,838 A | 3/1999 | Marx et al. | ............. | 356/351 |
| 5,963,329 A | 10/1999 | Conrad et al. | ............. | 356/372 |
| 6,153,886 A * | 11/2000 | Hagiwara et al. | ............. | 250/548 |
| 6,608,690 B2 | 8/2003 | Niu et al. | ............. | 356/635 |
| 6,699,624 B2 | 3/2004 | Niu et al. | ............. | 430/5 |
| 6,704,661 B1 | 3/2004 | Opsal et al. | ............. | 702/27 |
| 6,721,691 B2 | 4/2004 | Bao et al. | ............. | 702/189 |
| 6,738,138 B2 | 5/2004 | Wei | ............. | 356/369 |
| 6,753,961 B1 | 6/2004 | Norton et al. | ............. | 356/364 |
| 6,768,983 B1 | 7/2004 | Jakatdar et al. | ............. | 706/46 |
| 6,772,084 B2 | 8/2004 | Bischoff et al. | ............. | 702/127 |
| 6,785,638 B2 | 8/2004 | Niu et al. | ............. | 702/189 |
| 6,813,034 B2 | 11/2004 | Rosencwaig et al. | ............. | 356/601 |
| 6,819,426 B2 | 11/2004 | Sezginer et al. | ............. | 356/401 |
| 6,856,408 B2 | 2/2005 | Raymond | ............. | 356/601 |
| 6,919,964 B2 | 7/2005 | Chu | ............. | 356/601 |
| 6,927,004 B2 * | 8/2005 | Eurlings et al. | ............. | 430/5 |
| 6,928,628 B2 | 8/2005 | Seligson et al. | ............. | 716/4 |
| 6,972,852 B2 | 12/2005 | Opsal et al. | ............. | 356/625 |
| 6,974,962 B2 | 12/2005 | Brill et al. | ............. | 250/548 |
| 6,987,572 B2 | 1/2006 | Lakkapragada et al. | ............. | 356/601 |
| 7,046,376 B2 | 5/2006 | Sezginer | ............. | 356/601 |

(Continued)

FOREIGN PATENT DOCUMENTS

EP    1 628 164 A2    2/2006

(Continued)

*Primary Examiner*—L. G Lauchman
(74) *Attorney, Agent, or Firm*—Sterne, Kessler, Goldstein & Fox P.L.L.C.

(57) ABSTRACT

An overlay marker for use with a scatterometer includes two overlying two-dimensional gratings. The two gratings have the same pitch but the upper grating has a lower duty ratio. Cross-talk between X and Y overlay measurements can therefore be avoided. The gratings may be directly overlying or off set so as to be interleaved in one or two directions.

20 Claims, 5 Drawing Sheets

U.S. PATENT DOCUMENTS

| | | |
|---|---|---|
| 7,061,615 B1 | 6/2006 | Lowe-Webb ................. 356/401 |
| 7,061,623 B2 | 6/2006 | Davidson .................... 356/497 |
| 7,061,627 B2 | 6/2006 | Opsal et al. ................. 356/601 |
| 7,068,363 B2 | 6/2006 | Bevis et al. ............... 356/237.5 |
| 7,283,236 B2 * | 10/2007 | Presura et al. .............. 356/401 |
| 2004/0119970 A1 | 6/2004 | Dusa et al. ............... 356/237.1 |
| 2006/0033921 A1 | 2/2006 | Den Boef et al. ........... 356/446 |
| 2006/0066855 A1 | 3/2006 | Den Boef et al. ........... 356/401 |
| 2006/0126074 A1 | 6/2006 | Van Der Werf et al. ..... 356/489 |
| 2006/0139592 A1 | 6/2006 | Den Boef et al. ............. 355/53 |

FOREIGN PATENT DOCUMENTS

EP  1 628 164 A3  4/2006

* cited by examiner

INSPECTION METHOD AND APPARATUS, LITHOGRAPHIC APPARATUS, LITHOGRAPHIC PROCESSING CELL AND DEVICE MANUFACTURING METHOD, SUBSTRATE FOR USE IN THE METHODS

FIELD

The present invention relates to methods of inspection usable, for example, in the manufacture of devices by lithographic techniques and to methods of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is desirable to measure parameters of the patterned substrate, for example the overlay error between successive layers formed in or on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

One property of a substrate that can be measured using a scatterometer is overlay, that is the difference in position between two process layers in the substrate that ought to be exactly aligned. To measure overlay, a target, such as a grating, is printed in each of the layers whose relative overlay is to be measured at nominally the same position. The combined target is then inspected with a scatterometer and the misalignment of the two targets can be detected from the scatterometer spectrum. Overlay is measured in two directions, X and Y, so that if linear gratings are used two targets are required for each measurement site. Given that there may be 20 or 30 process layers in a complete device and multiple overlay measurement sites per target portion, while each target may be about 40 m by 40 m to accommodate the whole measurement spot, a substantial amount of space on the substrate is taken up by targets and hence not available for device structures.

It has therefore been proposed to use a two-dimensional grating, or checkerboard grating, which halves the amount of space required. However, it has been determined that there is cross-talk between the overlay in the X and Y directions as measured by a scatterometer. Such cross-talk complicates the computation of the measurement to be made and reduces its accuracy.

SUMMARY

It is desirable to provide a method of measuring overlay and a target for use in measuring overlay that reduces the amount of space required on the substrate while avoiding cross-talk between measurement directions.

According to an embodiment of the invention, there is provided a method of measuring overlay between a first layer and a second layer of a substrate, the first layer having therein a first marker component including a two-dimensional grating having a first pitch and a first duty ratio, the second layer having therein a second marker component including a two-dimensional grating having a second pitch and a second duty ratio, the second marker component overlying the first marker component, the method including directing a measurement beam onto the first and second marker components; detecting radiation from the measurement beam diffracted by the first and second marker components; determining the overlay from the detected radiation; wherein the first pitch is equal to the second pitch and the first duty ratio is different from the second duty ratio.

According to an embodiment of the invention, there is provided an inspection apparatus configured to measure overlay between a first layer and a second layer of a substrate, the first layer having therein a first marker component including a two-dimensional grating having a first pitch and a first duty ratio, the second layer having therein a second marker component including a two-dimensional grating having a second pitch and a second duty ratio, the second marker component overlying the first marker component, the apparatus including an illumination optical system configured to direct a measurement beam onto the first and second marker components; a detection optical system configured to detect radiation from the measurement beam diffracted by the first and second marker components; a computing device configured to determine the overlay from the detected radiation on the basis that the first pitch is equal to the second pitch and the first duty ratio is different from the second duty ratio.

According to an embodiment of the invention, there is provided a device manufacturing method including forming in a first layer of a substrate a first marker component including a two-dimensional grating having a first pitch and a first duty ratio; forming in a second layer of the substrate a second marker component including a two-dimensional grating having a second pitch and a second duty ratio, the second marker component overlying the first marker component; wherein the first pitch is equal to the second pitch and the first duty ratio is different from the second duty ratio.

According to an embodiment of the invention, there is provided a substrate having a first layer and a second layer, the first layer having therein a first marker component including a two-dimensional grating having a first pitch and a first duty ratio, the second layer having therein a second marker component including a two-dimensional grating having a second pitch and a second duty ratio, the second marker component overlying the first marker component; wherein the first pitch is equal to the second pitch and the first duty ratio is different from the second duty ratio.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1A:
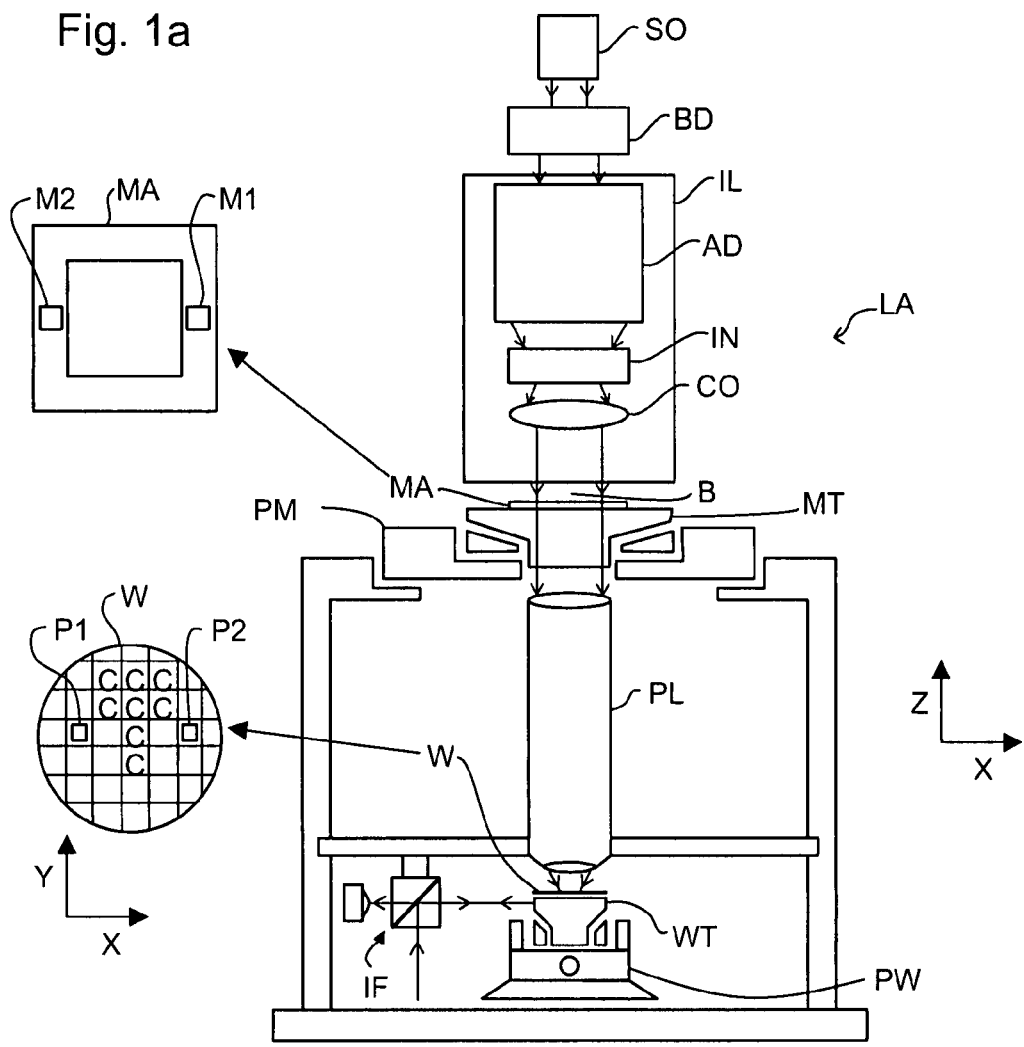
FIG. 1a depicts a lithographic apparatus in accordance with an embodiment of the invention.

FIG. 1a schematically depicts a lithographic apparatus. The apparatus includes an illumination system (illuminator) IL configured to condition a radiation beam B (e.g. UV radiation or DUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1a, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device (e.g. mask) MA, the radiation beam B passes through the projection system PL, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1a) can be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 1B:
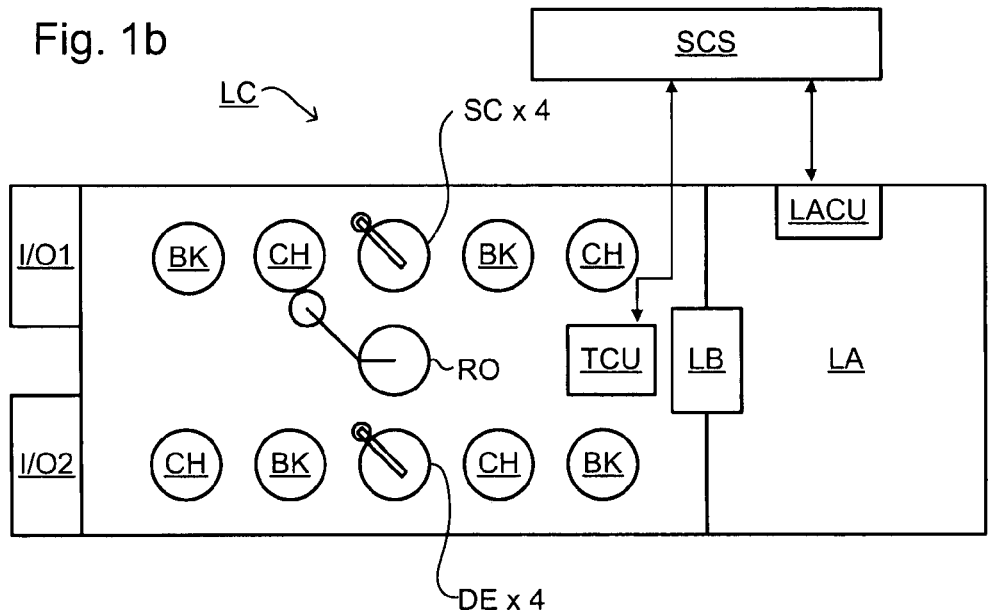
FIG. 1b depicts a lithographic cell or cluster in accordance with an embodiment of the invention.

As shown in FIG. 1b, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked—to improve yield—or discarded—thereby avoiding performing exposures on substrates that are known to be faulty. In a case where only some target portions of a substrate are faulty, further exposures can be performed only on those target portions which are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 2:
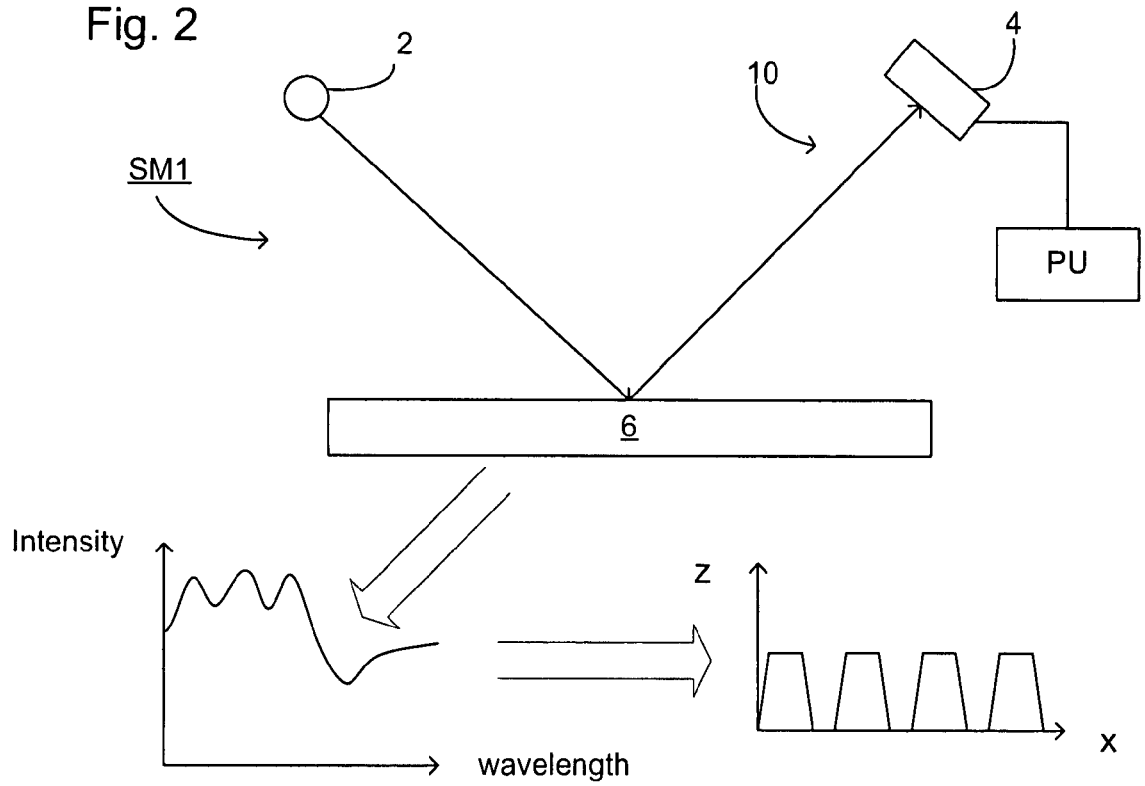
FIG. 2 depicts a first scatterometer in accordance with an embodiment of the invention.

FIG. 2 depicts a scatterometer SM1. It includes a broadband (white light) radiation projector 2 configured to project radiation onto a substrate 6. The reflected radiation is passed to a spectrometer detector 4, configured to measure a spectrum 10 (intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 2. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 3:
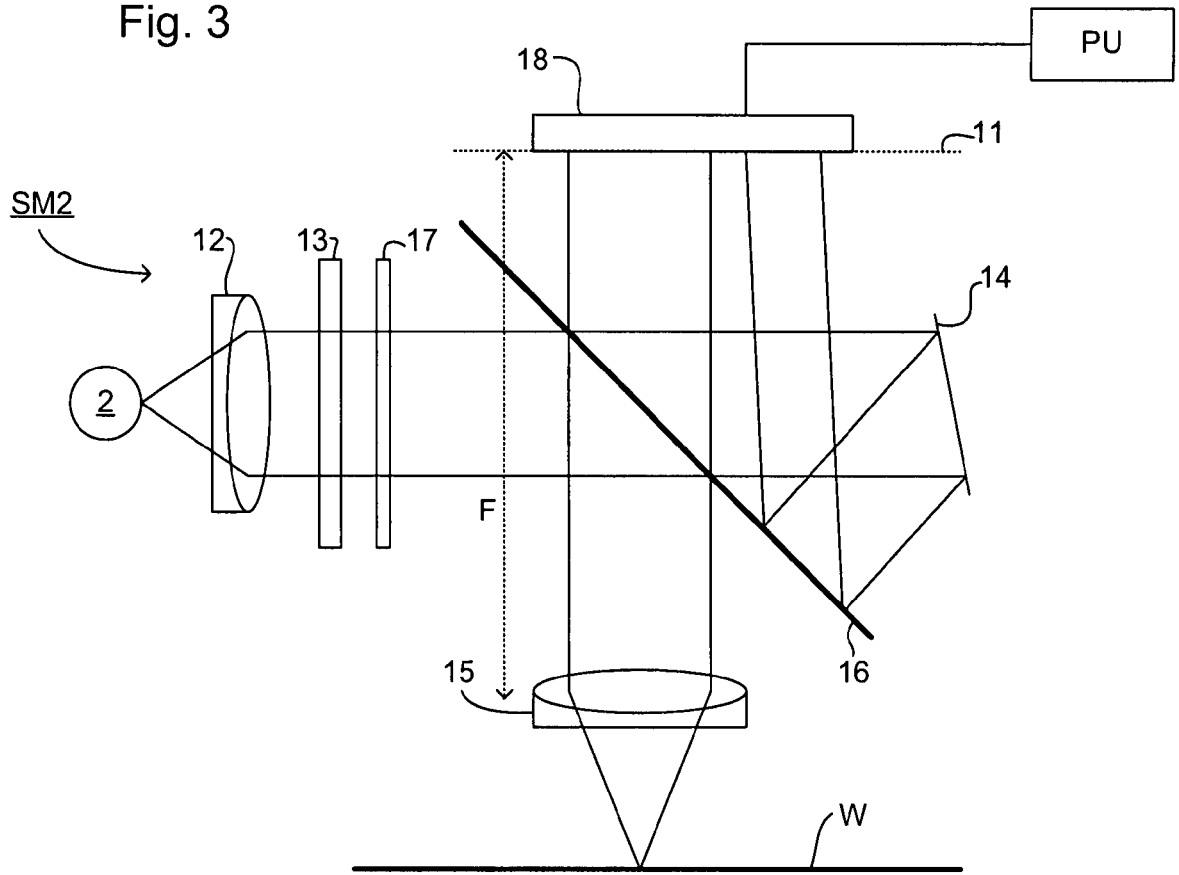
FIG. 3 depicts a second scatterometer in accordance with an embodiment of the invention.

Another scatterometer SM2 is shown in FIG. 3. In this device, the radiation emitted by radiation source 2 is focused using lens system 12 through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of the substrate target can be measured. The detector 18 may be, for example, an array of CCD or CMOS sensors, and may use an integration time of, for example, 40 milliseconds per frame.

A reference beam is often used for example to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18.

A set of interference filters 13 is available to select a wavelength of interest in the range of, say, about 405-790 nm or even lower, such as about 200-300 nm. The interference filter may be tunable rather than including a set of different filters. A grating could be used instead of interference filters.

The detector 18 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e. one with a wide range of light frequencies or wavelengths—and therefore of colors) is possible, which gives a large etendue, allowing the mixing of multiple wavelengths. The plurality of wavelengths in the broadband preferably each has a bandwidth of $\delta\lambda$ and a spacing of at least 2 $\delta\lambda$ (i.e. twice the bandwidth). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP-1 628 164-A.

The target on substrate W may be a grating, which is printed such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

Figure 4:
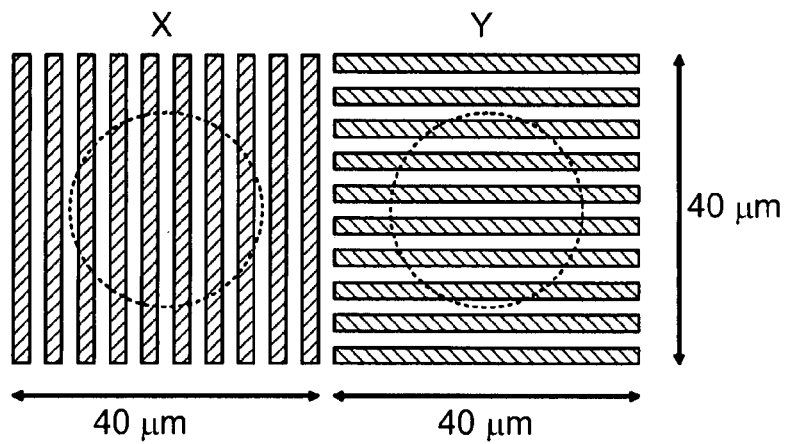
FIG. 4 depicts a pair of 1-dimensional gratings for measuring overlay in two directions.

FIG. 4 depicts a pair of gratings, one with lines extending in a first, Y, direction and the other with lines extending in a second, X, direction that is orthogonal to the first direction as known for use in measuring overlay using a scatterometer. A pair of such gratings are printed in a first, lower process layer and a pair are printed at the same nominal location in a second, higher process layer. A scatterometer illuminates each pair of overlying gratings and determines the X overlay error from spectrum reflected from the pair of gratings with lines extending in the Y direction and Y overlay from spectrum reflected from the pair of gratings with lines extending in the X direction, e.g. by reconstruction of the respective structures. Since each grating must be of a sufficient size, e.g. 40 m by 40 m, that the measurement spot MS falls wholly within the each grating, otherwise errors will be introduced dependent on the relative position of the measurement spot and target, the targets occupy a substantial amount of space on the substrate that could desirably be allocated to other functions, e.g. device structures.

Figure 5:
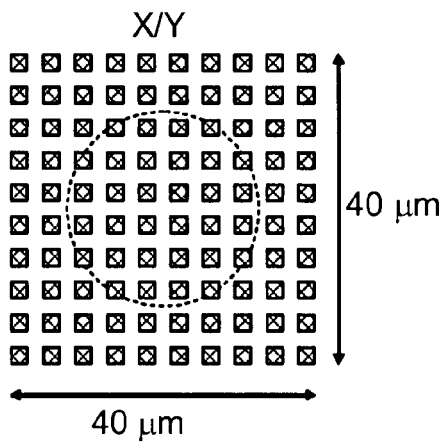
FIG. 5 depicts a 2-dimensional grating for use in measuring overlay in two directions.

FIG. 5 shows an alternative form of target that seeks to reduce the amount of space taken up by overlay targets. In this target, a single, 2-dimensional grating is printed in each layer. The grating looks like a checkerboard and as it has periodicity in two directions can be used to detect overlay in both X and Y simultaneously. However, as will be explained below, this target exhibits cross-talk between the X and Y overlay values. Such cross-talk complicates computation of the overlay value and reduces accuracy of the measurement.

Figure 6:
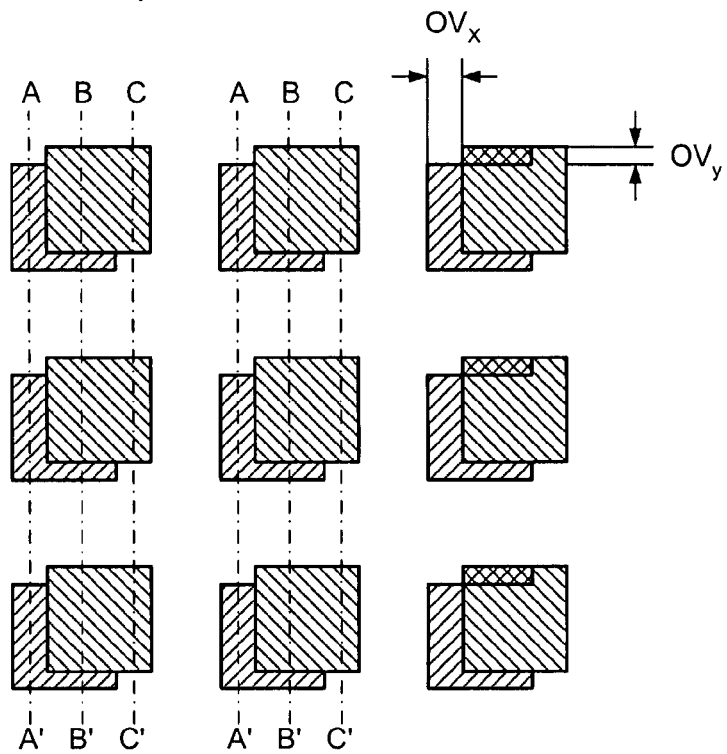
FIG. 6 depicts parts of two overlying 2-dimensional gratings showing overlay in two directions.

A part of two overlying gratings as in FIG. 5 is shown enlarged in FIG. 6. The grating in the lower layer is shown with diagonal hatching rising to the right and the grating in the upper layer with diagonal hatching rising to the right. There are overlay errors $OV_x$ and $OV_y$ in both X and Y directions. A spectrum recorded by an angular resolved scatterometer from the overlying gratings essentially records the asymmetry in the combined pattern. In the Y direction, the A-A' and C-C' cross-sections exhibit no asymmetry, the asymmetry is in the B-B' cross-section. However, as can be seen from the cross-hatched part the proportion of each cycle of the combined pattern that exhibits asymmetry in the Y direction depends on the overlay error in the X direction. The converse is true in the X-direction.

To avoid this, an embodiment of the present invention provides an overlay target which includes a first two-dimensional grating provided in a first process layer and a second two-dimensional grating provided in a second process layer overlying the first two-dimensional grating. The two gratings have the same period and general form in each direction but different duty cycles. Preferably, each grating includes scattering parts and relatively transmissive parts and the ratio of areas of scattering parts to non-scattering parts in the grating in the upper layer (that which will be on the side of the incident beam during measurement) is less than that of the grating in the lower layer. The scattering parts may differ from the non-scattering parts in any optical or physical property sufficient to cause diffraction of the measurement beam.

Figure 7:
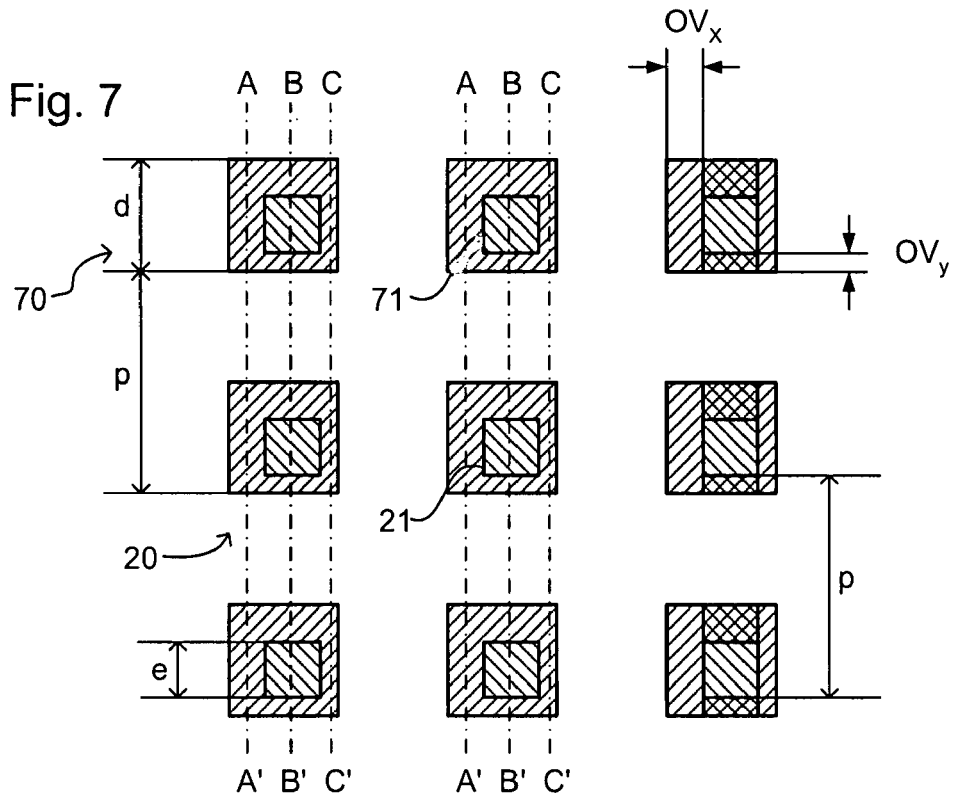
FIG. 7 depicts parts of two overlying 2-dimensional gratings according to an embodiment of the invention showing overlay in two directions.

An example of this is shown in FIG. 7. The lower grating 70 includes scattering parts 71 of dimension d positioned on a square grid of rows and columns parallel to the X and Y directions respectively with a pitch p approximately 2d. It will be appreciated that although the scattering parts 71 are shown as square they will in a real grating be rounded to a greater or lesser degree depending on the process by which they have been formed. In one example, p=1 µm and d=600 nm. The pitch is chosen in dependence on the wavelength of the measurement beam and the NA of the objective lens of the scatterometer. Thus the duty ratios, defined as the ratio of the length of the scattering part in the relevant direction to the pitch in the relevant direction, in the X and Y directions of the lower grating is more than about 50%, in the specific example it is about 60%. Preferably, the duty ratio is in the range of from about 50 to 80%, more preferably about 50 to 70%, most preferably about 55 to 65%. Preferably the pitch is between about 500 nm and 2 µm, more preferably between about 750 nm and 1.5 µm, most preferably between about 900 nm and 1.2 µm. The pitch and duty ratios are preferably the same in the X and Y directions but may differ.

The upper grating 20 includes scattering parts 21 that are positioned on a grid corresponding to that of the lower grating 70, in other words has the same pitch(es), and are the same general shape, e.g. square, as the scattering parts 71 of the lower grating 70. However, the duty ratio(s) of the upper grating 20 is(are) different from that of the lower grating, preferably lower. In an embodiment of the invention, the scattering parts 21 have a dimension e of 400 nm so that the duty ratio is about 40%. Preferably, the duty ratio of the upper grating is at least about 5% less than the duty ratio of the lower grating, more preferably at least about 10% less, most preferably at least about 15% less.

The difference between the dimensions of the scattering parts in the upper and lower gratings determines the amount of overlay error that can be accommodated without crosstalk. In the example, the difference is 200 nm and hence an overlay error of up to this value can be accommodated without crosstalk.

Figure 8:
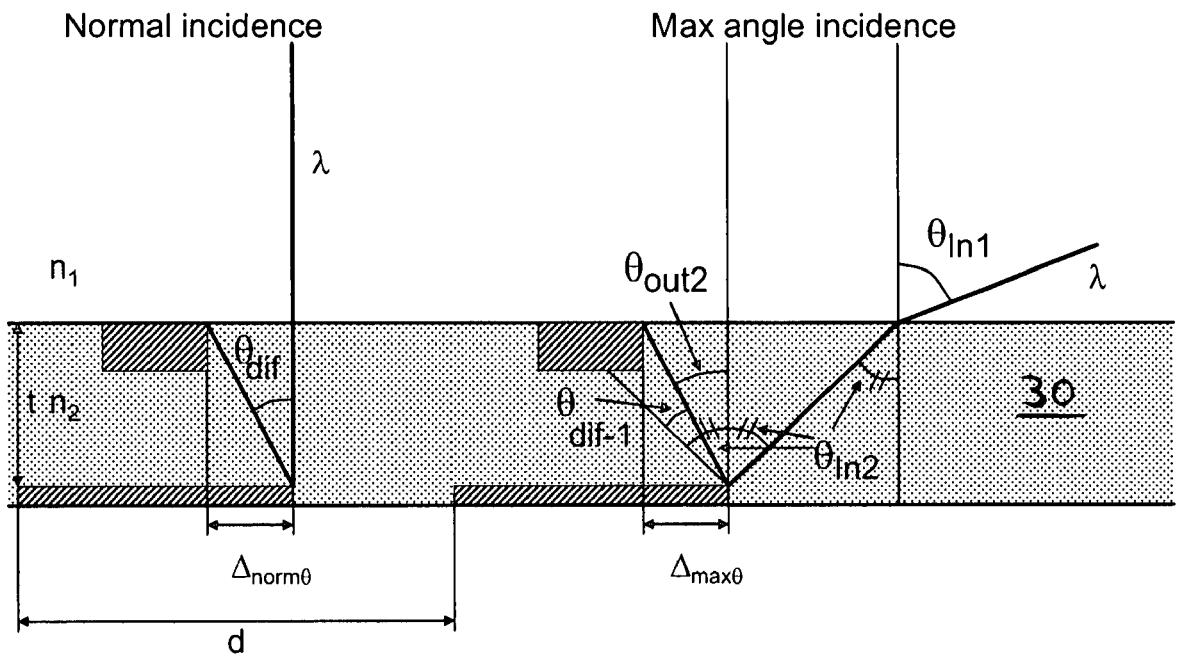
FIG. 8 is a diagram referred to in describing the relative sizes of the two gratings of FIG. 7.

A lower limit may apply with thick layers between the upper and lower gratings. This is illustrated in FIG. 8. A ray of the measurement beam incident from a medium of refractive index $n_1$ at an angle $\theta_{in1}$ refracts in a layer 30 of thickness t and refractive index $n_2$ to be incident on the lower grating, which has pitch d, at an angle $\theta_{in2}$. It then diffracts at an angle $\theta_{dif\text{-}1}$. A perpendicular ray is diffracted from the lower grating in the first order at an angle $\theta_{dif}$. The requirement for both of these rays, representing the extreme and chief rays of a high-NA beam, to see the scattering parts of the upper grating within the scattering parts of the lower grating sets a limit on the difference between the sizes. For a 1 µm pitch, layer thickness t of 0.4 µm, refractive index $n_2$ 1.5, and extreme ray angle of incidence $\theta_{in1}$ of 72°, a minimum difference of 150 nm is required. In general, at normal incidence the minimum difference in size of the grating segments is given by:

$$\Delta_{norm\theta} = t \tan(\theta_{dif}) \quad (1)$$

with $\theta_{dif}$ from the grating formula for the 1st order diffraction in medium with $n_2$ given by:

$$d \sin(\theta_{dif}) = 1/n_2 \quad (2)$$

At maximum incidence angle, the minimum difference in size of the grating segments is given by:

$$\Delta_{max\theta} = t \tan(\theta_{in2} + \theta_{dif\text{-}1}) \quad (3)$$

with $\theta_{dif\text{-}1}$ from the grating formula for the −1st order diffraction in medium with refractive index $n_2$ given by:

$$d \sin(\theta_{dif\text{-}1}) = -\lambda/n_2 \quad (4)$$

and $\theta i_{n2}$ from Snells law:

$$n_2 \sin(\theta_{in2}) = n_1 \sin(\theta_{in1}) \quad (5)$$

for a maximum angle equal to ray from lens numerical aperture (NA):

$$NA = n_1 \sin(\theta_{in1}).$$

Figure 9:
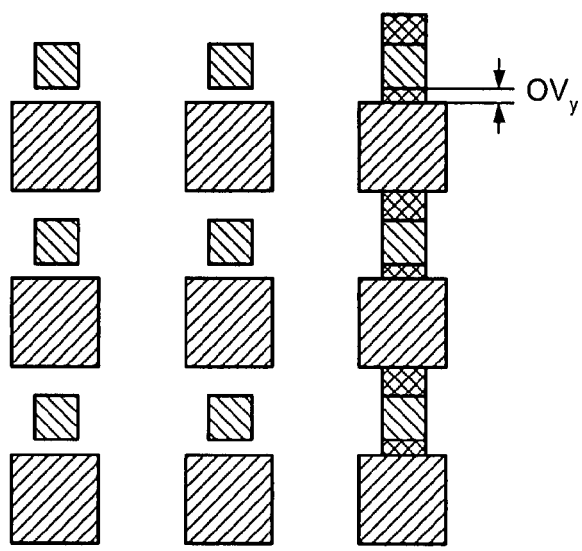
FIGS. 9 to 11 depict parts of two overlying 2-dimensional gratings according to other embodiments of the invention showing overlay in two directions.
Figure 10:
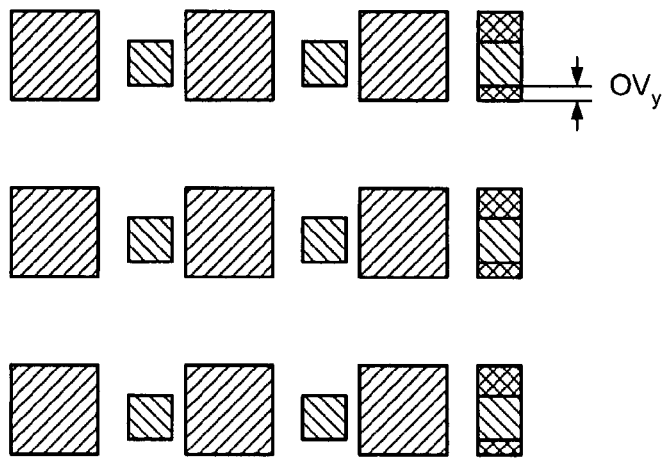
Figure 11:
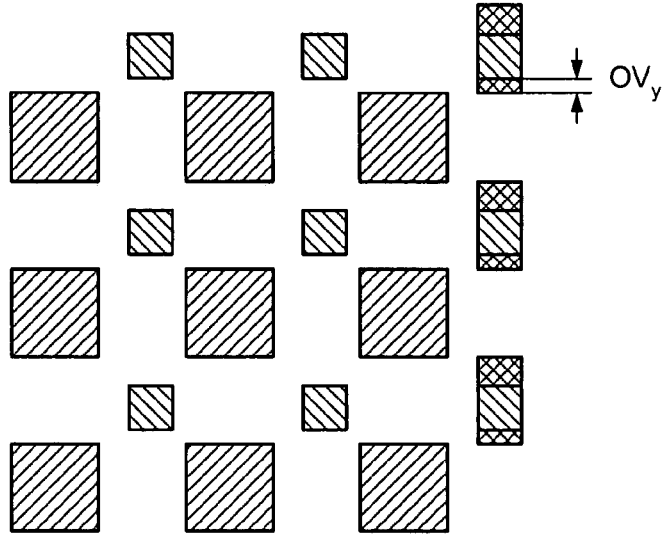

Although in FIG. 7, the nominal positions of the scattering parts 21 of the upper grating are shown overlying the scattering parts 71 of the lower grating, it is also possible to interleave the gratings in X (as shown in FIG. 9), Y (FIG. 10) or both X and Y (FIG. 11).

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method of measuring overlay between a first layer and a second layer of a substrate, the first layer having therein a first marker component comprising a two-dimensional grating having a first pitch and a first duty ratio, the second layer having therein a second marker component comprising a two-dimensional grating having a second pitch and a second duty ratio, the second marker component overlying the first marker component, the method comprising:
   directing a measurement beam onto the first and second marker components;
   detecting radiation from the measurement beam diffracted by the first and second marker components;
   determining the overlay from the detected radiation;
   wherein the first pitch is substantially equal to the second pitch and the first duty ratio is different from the second duty ratio.

2. A method according to claim 1, wherein the second duty ratio is less than the first duty ratio.

3. A method according to claim 2, wherein the second duty ratio is at least 5% less than the first duty ratio.

4. A method according to claim 3, wherein the second duty ratio is at least 10% less than the first duty ratio.

5. A method according to claim 4, wherein the second duty ratio is at least 15% less than the first duty ratio.

6. A method according to claim 1, wherein the first and second marker components have the same pitch in two orthogonal directions.

7. A method according to claim 1, wherein the first marker component comprises first scattering parts having a first dimension and the second marker component comprises second scattering parts having a second dimension, the second dimension being less than the first dimension.

8. A method according to claim 7, wherein the second dimension is at least 100 nm less than the first dimension.

9. A method according to claim 8, wherein the second dimension is at least 150 nm less than the first dimension.

10. A method according to claim 9, wherein the second dimension is at least 200 nm less than the first dimension.

11. A method according to claim 7, wherein the second dimension is at least $\Delta_{norm\theta}$ less than the first dimension, where $\Delta_{norm\theta}$ is given by:

$$\Delta_{norm\theta} = t \tan(\theta_{dif}) \quad (1)$$

and $\theta_{dif}$ is given by:

$$d \sin(\theta_{dif}) = \lambda/n_2 \quad (2)$$

where t is the thickness of a layer between the first and second marker components, $n_2$ the refractive index of that layer and d is the first pitch.

12. A method according to claim 7, wherein the second dimension is at least $\Delta_{max\theta}$ less than the first dimension, where $\Delta_{max\theta}$ is given by:

$$\Delta_{max\theta} = t \tan(\theta_{in2} + \theta_{dif-1}) \quad (3)$$

and $\theta_{dif-1}$ is given by:

$$d \sin(\theta_{dif-1}) = -\lambda/n_2 \quad (4)$$

and $\theta i_{n2}$ is given by:

$$n_2 \sin(\theta_{in2}) = n_1 \sin(\theta_{in1}) \quad (5)$$

and $\theta_{in1}$ is given by:

$$NA = n_1 \sin(\theta_{in1})$$

where t is the thickness of a layer between the first and second marker components, $n_2$ the refractive index of that layer, d is the first pitch and NA is the numeric aperture of a lens used to direct the measurement beam onto the substrate.

13. A method according to claim 1, wherein the first marker component comprises first scattering parts and the second marker component comprises second scattering parts, the nominal locations of the second scattering parts directly overlying the nominal locations of the first scattering parts.

14. A method according to claim 1, wherein the first marker component comprises first scattering parts and the second marker component comprises second scattering parts, the nominal locations of the second scattering parts being displaced in a direction substantially parallel to the surface of the substrate from the nominal locations of the first scattering parts such that the first and second scattering parts are interleaved in one direction.

15. A method according to claim 1, wherein the first marker component comprises first scattering parts and the second marker component comprises second scattering parts, the nominal locations of the second scattering parts being displaced in a substantially direction parallel to the surface of the substrate from the nominal locations of the first scattering parts such that the first and second scattering parts are interleaved in two orthogonal directions.

16. An inspection apparatus configured to measure overlay between a first layer and a second layer of a substrate, the first layer having therein a first marker component comprising a two-dimensional grating having a first pitch and a first duty ratio, the second layer having therein a second marker component comprising a two-dimensional grating having a second pitch and a second duty ratio, the second marker component overlying the first marker component, the apparatus comprising:
   an illumination optical system configured to direct a measurement beam onto the first and second marker components;
   a detection optical system configured to detect radiation from the measurement beam diffracted by the first and second marker components;
   a computing device configured to determine the overlay from the detected radiation on the basis that the first pitch is equal to the second pitch and the first duty ratio is different from the second duty ratio.

17. A lithographic apparatus comprising a projections system configured to project an image of a pattern onto a substrate and an inspection apparatus configured to measure overlay between a first layer and a second layer of a substrate, the first layer having therein a first marker component comprising a two-dimensional grating having a first pitch and a first duty ratio, the second layer having therein a second marker component comprising a two-dimensional grating having a second pitch and a second duty ratio, the second marker component overlying the first marker component, the inspection apparatus comprising:

- an illumination optical system configured to direct a measurement beam onto the first and second marker components;
- a detection optical system configured to detect radiation from the measurement beam diffracted by the first and second marker components;
- a computing device configured to determine the overlay from the detected radiation on the basis that the first pitch is equal to the second pitch and the first duty ratio is different from the second duty ratio.

18. A lithographic cell comprising a lithographic apparatus, a process unit configured to perform a chemical process on a substrate exposed by the lithographic apparatus and an inspection apparatus according to claim 16.

19. A device manufacturing method comprising:

- forming in a first layer of a substrate a first marker component comprising a two-dimensional grating having a first pitch and a first duty ratio;
- forming in a second layer of the substrate a second marker component comprising a two-dimensional grating having a second pitch and a second duty ratio, the second marker component overlying the first marker component;
- wherein the first pitch is equal to the second pitch and the first duty ratio is different from the second duty ratio.

20. A substrate having a first layer and a second layer, the first layer having therein a first marker component comprising a two-dimensional grating having a first pitch and a first duty ratio, the second layer having therein a second marker component comprising a two-dimensional grating having a second pitch and a second duty ratio, the second marker component overlying the first marker component;

wherein the first pitch is equal to the second pitch and the first duty ratio is different from the second duty ratio.

\* \* \* \* \*